United States Patent
Crippen et al.

(10) Patent No.: US 6,927,975 B2
(45) Date of Patent: Aug. 9, 2005

(54) SERVER BLADE MODULAR CHASSIS MECHANICAL AND THERMAL DESIGN

(75) Inventors: Martin J. Crippen, Apex, NC (US); Jason A. Matteson, Raleigh, NC (US); Michael S. Miller, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 10/607,713

(22) Filed: Jun. 27, 2003

(65) Prior Publication Data

US 2004/0264128 A1 Dec. 30, 2004

(51) Int. Cl.$^7$ .................................................. H05K 5/00
(52) U.S. Cl. ...................... 361/687; 361/695; 361/727; 312/223.1; 312/223.2
(58) Field of Search ................................ 361/683–695, 361/724–732; 312/223.1, 223.2; 165/124–126

(56) References Cited

U.S. PATENT DOCUMENTS

| | | |
|---|---|---|
| 4,860,163 A | 8/1989 | Sarath |
| 5,420,750 A | 5/1995 | Freige et al. |
| 5,663,868 A | 9/1997 | Stalley |
| 6,000,464 A | 12/1999 | Scafidi et al. |
| 6,011,688 A | 1/2000 | Thornburg et al. |
| 6,163,454 A | 12/2000 | Strickler |
| 6,496,366 B1 | 12/2002 | Coglitore et al. |
| 6,778,386 B2 * | 8/2004 | Garnett et al. ............. 361/687 |
| 2002/0126449 A1 | 9/2002 | Casebolt |
| 2002/0191376 A1 * | 12/2002 | Ota et al. .................... 361/695 |
| 2003/0002254 A1 | 1/2003 | Faneuf et al. |
| 2003/0030978 A1 | 2/2003 | Garnett et al. |
| 2003/0053293 A1 | 3/2003 | Beitelmal et al. |

\* cited by examiner

*Primary Examiner*—Anatoly Vortman
*Assistant Examiner*—Anthony Q. Edwards
(74) *Attorney, Agent, or Firm*—Sawyer Law Group LLP (57) ABSTRACT

A method and system for packaging a computer system is disclosed. The computer system is capable of including a plurality of blades, a first plurality of devices, and a second plurality of devices. The method and system include providing a chassis having a first cavity, a first plenum, a second plenum and a common plenum therein. The first cavity retains the blades in parallel. The chassis is configured such that air sufficient to cool the blades is drawn into the chassis and through the blades. The first plenum is configured such that a first portion of the air sufficient to cool the first plurality of devices is drawn from the blades into the first plenum, through the first plurality of devices and into the common plenum. The second plenum is configured in an analogous manner for the second plurality of devices. The common plenum is configured such that a remaining portion of the air from the blades is drawn into the common plenum, and such that the first and second portions of the air are received into the common plenum from the first and second plurality of devices, respectively.

22 Claims, 8 Drawing Sheets

SERVER BLADE MODULAR CHASSIS MECHANICAL AND THERMAL DESIGN

FIELD OF THE INVENTION

The present invention relates to computer systems, and more particularly to a method and system for providing a chassis having an improved mechanical and thermal design.

BACKGROUND OF THE INVENTION

In server design, as in the design of many other computer systems, there is a trend toward higher densities of components. For example, it is desirable to put a greater number of server blades into a package of a given size. Typically, a larger number of blades correspond to a larger number of other components, such as power supplies, switches and management modules. Thus, the package, typically a chassis, is desired to more densely pack other components in addition to the blades.

Although high density packaging of components is desired, one of ordinary skill in the art will readily recognize that conventional chassis may have difficulty in meeting the needs of the components, such as the cooling and servicing. For example, each blade has a certain cooling requirement. A set of blades has a corresponding cooling requirement. More blades correspond to a higher volume of coolant, such as air, that must be drawn through the blades. Furthermore, it is more difficult to draw air through blades that are more tightly packet because the resistance to the movement of air increases. Similarly, the other components, such as power supplies, also require cooling. Consequently, adequate cooling may be a bar to providing a high-density server.

Furthermore, the blades might also need to be serviced during the lifetime of the computer system. When blades are tightly packed, it may be difficult or impossible to reach portions of the blade required for diagnosis of faults or repair. As a result, servicing of the blades in situ becomes difficult or impossible. Thus, some mechanism for accessing the blades easily is desired. Similarly, the other components, such as power supplies, also require cooling and periodic servicing. Consequently, similar issues are faced in high-density packaging of such components.

Accordingly, what is needed is a system and method for packaging a computer system, such as a server, at higher densities while enabling ease of access to components of the computer system. The present invention addresses such a need.

SUMMARY OF THE INVENTION

The present invention provides a method and system for packaging a computer system capable of including a plurality of blades, a first plurality of devices, and a second plurality of devices. The method and system comprise providing a chassis having a first cavity, a first plenum, a second plenum and a common plenum therein. The first cavity retains the plurality of blades in parallel. The chassis is configured such that air sufficient to cool the plurality of blades is drawn into the chassis. The first plenum is configured such that a first portion of the air is drawn from the plurality of blades into the first plenum, through the first plurality of devices and into the common plenum. The first portion of the air is sufficient to cool the first plurality of devices. The second plenum is configured such that a second portion of the air is drawn from the plurality of blades into the second plenum, through the second plurality of devices and into the common plenum. The second portion of the air is sufficient to cool the second plurality of devices. The common plenum is configured such that a remaining portion of the air is drawn from the plurality of blades into the common plenum, the first portion of the air is received into the common plenum from the first plurality of devices, and the second portion of the air is received into the common plenum from the second plurality of devices.

According to the system and method disclosed herein, the present invention provides a chassis which allows for a high-density packing of blades and devices as well as ease of servicing.

DETAILED DESCRIPTION OF THE INVENTION

The present invention relates to an improvement in computer systems. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for packaging a computer system capable of including a plurality of blades, a first plurality of devices, and a second plurality of devices. The method and system comprise providing a chassis having a first cavity, a first plenum, a second plenum and a common plenum therein. The first cavity retains the plurality of blades in parallel. The chassis is configured such that air sufficient to cool the plurality of blades is drawn into the chassis. The first plenum is configured such that a first portion of the air is drawn from the plurality of blades into the first plenum, through the first plurality of devices and into the common plenum. The first portion of the air is sufficient to cool the first plurality of devices. The second plenum is configured such that a second portion of the air is drawn from the plurality of blades into the second plenum, through the second plurality of devices and into the common plenum. The second portion of the air is sufficient to cool the second plurality of devices. The common plenum is configured such that a remaining portion of the air is drawn from the plurality of blades into the common plenum, the first portion of the air is received into the common plenum from the first plurality of devices, and the second portion of the air is received into the common plenum from the second plurality of devices.

The present invention will be described in terms of a particular packaging system for a computer system having certain parts, such as fourteen blades. However, one of ordinary skill in the art will readily recognize that this method and system will operate effectively for other computer systems having additional and/or different components.

Figure 1A:
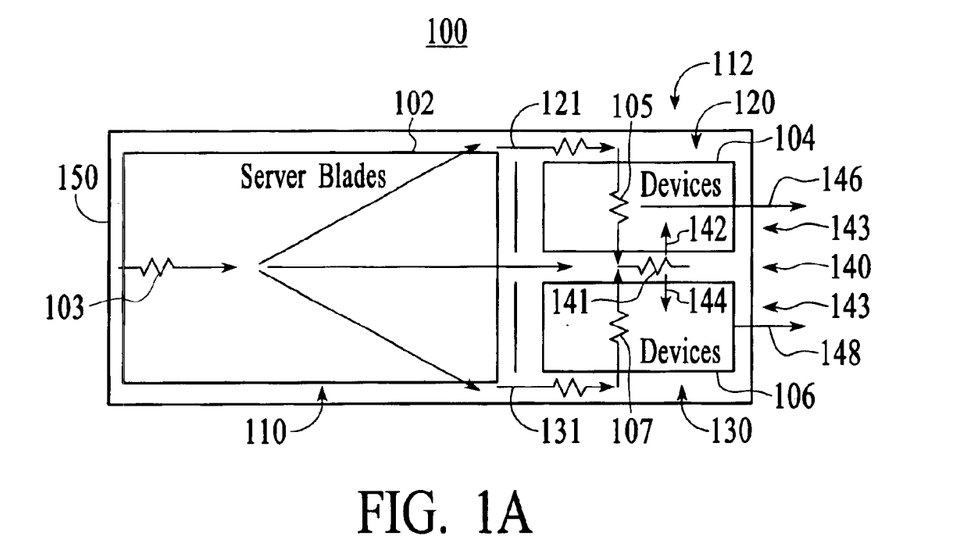
FIG. 1A is a high-level diagram of one embodiment of a system in accordance with the present invention for packaging a computer system.

To more particularly illustrate the method and system in accordance with the present invention, refer now to FIG. 1A, depicting a high-level, side view of one embodiment of a system 100 in accordance with the present invention for packaging a computer system including server blades 102 and devices 104 and 106. There are multiple server blades 102, preferably fourteen, though only one is depicted. The devices 104 and 106 are preferably modules that are configured to fit within the system 100 and lock in place. The system 100 is effectively a chassis 100 that includes cavities 110 and 112. The cavity 110 is preferably at the front of the chassis, while the cavity 112 is at the rear of the chassis 100. The cavity 110 is used to hold server blades 102, while the rear cavity 112 is used for the devices 104 and 106. Thus, individual blades 102 are in parallel. However, the blades 102 are in series with the devices 104 and 106. The devices 104 and 106 are in parallel. The chassis 100 also includes a first plenum 120, a second plenum 130, and a common plenum 140. Also depicted in each section are the resistances 103, 105 and 107, 121, 131, and 141 against moving the air, or static pressure drop, for the blades 102, devices 104 and 106, first plenum 120, second plenum 130, and common plenum 140. Furthermore, arrows 142, 144, 146, and 148 depict the movement of air from the common plenum 140 through blowers (not explicitly shown), and exhausted from the system 100.

In order to cool the components 102, 104, and 106 of the computer system, air is drawn into the cavity 110. The air passes through the blades 102 in parallel. The air travels in the direction of the arrows and enters the first plenum 120, the second plenum 130, and the common plenum 140. Thus, the air exiting the cavity 110 splits into three different parts, one of which travels to each of the plenums 120, 130, and 140. A first portion of the air travels to the first plenum 120 via aperture 172, through the devices 104, and into the common plenum 140. Thus, this portion of the air is first used to cool the blades 102, then used to cool the devices 104. The second portion of the air travels to the second plenum 130 from the aperture 174, through the devices 106, and into the common plenum 140. Thus, this portion of the air is first used to cool the blades 102, then used to cool the devices 106. A remaining portion of the air is provided from the blades 102 through the aperture 176 to the common plenum 140. The air in the common plenum 140 is expelled via exits 143. Typically, the exits 143 are through blowers (not shown in FIG. 1A) which draw the air through the system 100.

Because of the packaging architecture and thermal design of the system 100, higher density packing of components of the computer system can be achieved while meeting or exceeding the cooling requirements of the components of the computer system. In particular, the parallel arrangement of the blades 102, the serial arrangement between blades 102 and the devices 104 and 106, and the parallel arrangement of the devices 104 and 106 in conjunction with the plenums 120, 130, and 140 can enable this higher density packing. The parallel arrangement of the blades 102 allows substantially all the air entering the cavity 110 to cool the blades 102. The serial arrangement between blades 102 and the devices 104 and 106 in conjunction with the first and second plenum allows air used to cool the blades 102 to be used in cooling the devices 104 and 106. The parallel arrangement of the devices 104 and 106 allows a portion of the air from the blades 102 to be split between the devices 104 and 106 and still meet their cooling requirements. In addition, the common plenum 140 allows the excess air to be passed through the system 100 without passing through the devices 104 and 106. This configuration is desirable because the air through the common plenum faces a lower resistance than the air passed through the devices. Consequently, the blowers (not shown) which draw the air through the system 100 can more easily draw in a larger volume of air.

Figure 1B:
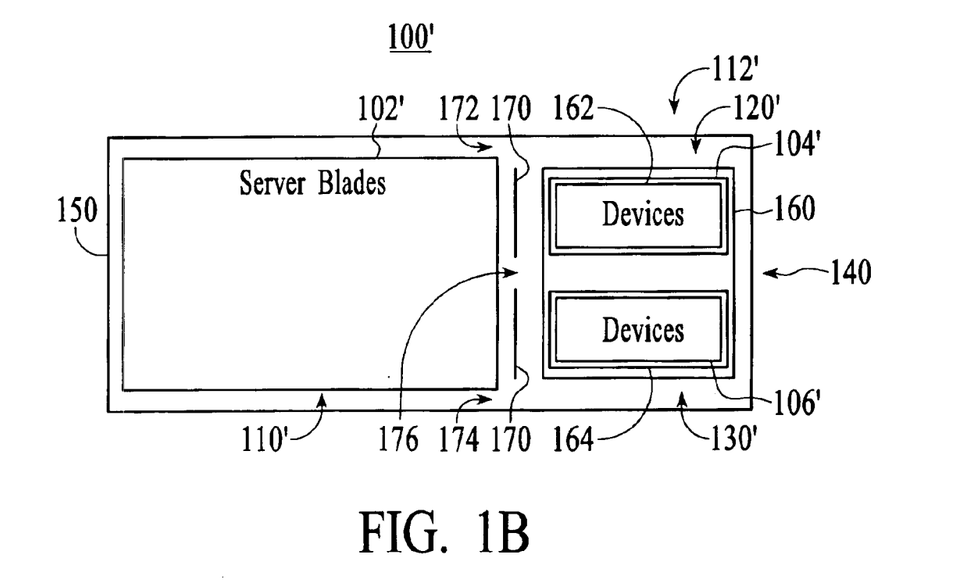
FIG. 1B is a high-level diagram of a preferred embodiment of a system in accordance with the present invention for packaging a computer system.

FIG. 1B is a high-level diagram of a preferred embodiment of a system 100' in accordance with the present invention for packaging a computer system. The system 100' has many of the same features as the system 100. Consequently, analogous components are labeled similarly. For example, the first cavity 110', the first plenum 120', the second plenum 130', and the common plenum 140' correspond to the first cavity 110', the first plenum 120', the second plenum 130', and the common plenum 140', respectively, of the system 100. However, the system 100' includes a main chassis 150, a switch-power-cooling (SPC) chassis 160, and a midplane 170. The midplane 170 is preferably a printed circuit board having apertures therein. For clarity, no arrows are shown in FIG. 1B. However, the flow of air should be substantially the same as in FIG. 1A.

The system 100' has the substantially the same arrangement of the plenums 120', 130', and 140', as well as substantially the same arrangement of the blades 102' and devices 104' and 106' as in the system 100. However, the system 100' is also modular in design. Thus, the system 100' includes the SPC chassis 160, that can be removed from the main chassis 150. The main chassis includes the cavity 110' for receiving the blades 102'. The SPC chassis 160 includes regions 162 and 164 for the devices 104' and 106', respectively. The devices 104' and 106' are preferably provided as modules configured to plug into the SPC chassis in the regions 162 and 164. In addition, the first plenum 120', the second plenum 130', and the common plenum 140 can be within the SPC chassis 160. In an alternate embodiment, the first plenum 120' and the second plenum 130' may be formed between the main chassis 150 and the SPC chassis 160.

Because the system 100' is modular in nature, the components of the system 100' can be separated relatively easily.

Thus, the SPC chassis 160 can be easily removed from the main chassis 150 or easily locked into place. Similarly, the modules for the devices 104' and 106' and the individual blades 102' can also be easily placed in or removed from the SPC chassis 160 and main chassis 150, respectively. Thus, the system 100' promotes easy assembly and disassembly for servicing. Furthermore, as described with respect to the system 100, the parallel blades 102' in series with the parallel devices 104' and 106' as well as the arrangement of the first plenum 120', the second plenum 130' and the common plenum 140' allow for cooling of the components of the computer system. In a preferred embodiment, the goal was for fifty percent of the air from the blades 102' to travel to the common plenum 140', twenty-five percent of the air from the blades 102' to travel to the first plenum 120', and twenty-five percent of the air from the blades 102' to travel to the second plenum 130'. In practice, a 45:19:16 split of air has been achieved through the common plenum 140', the bottom plenum 130", and the top plenum 120", respectively. Thus, the system 100' facilitates an easy to use, high-density computer system.

Figure 2A:
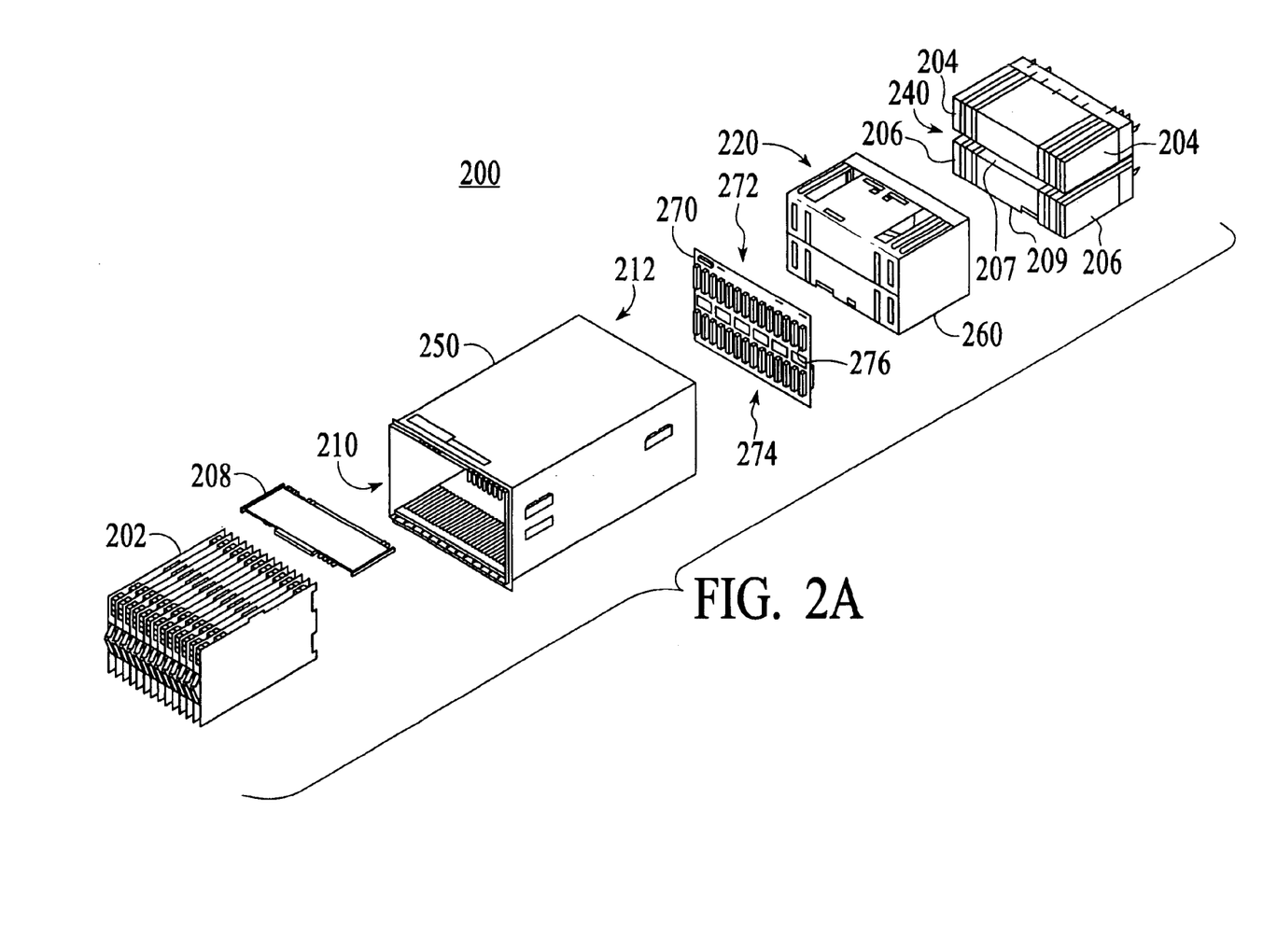
FIG. 2A is an exploded, perspective view of a preferred embodiment of a system in accordance with the present invention for packaging a computer system.
Figure 2B:
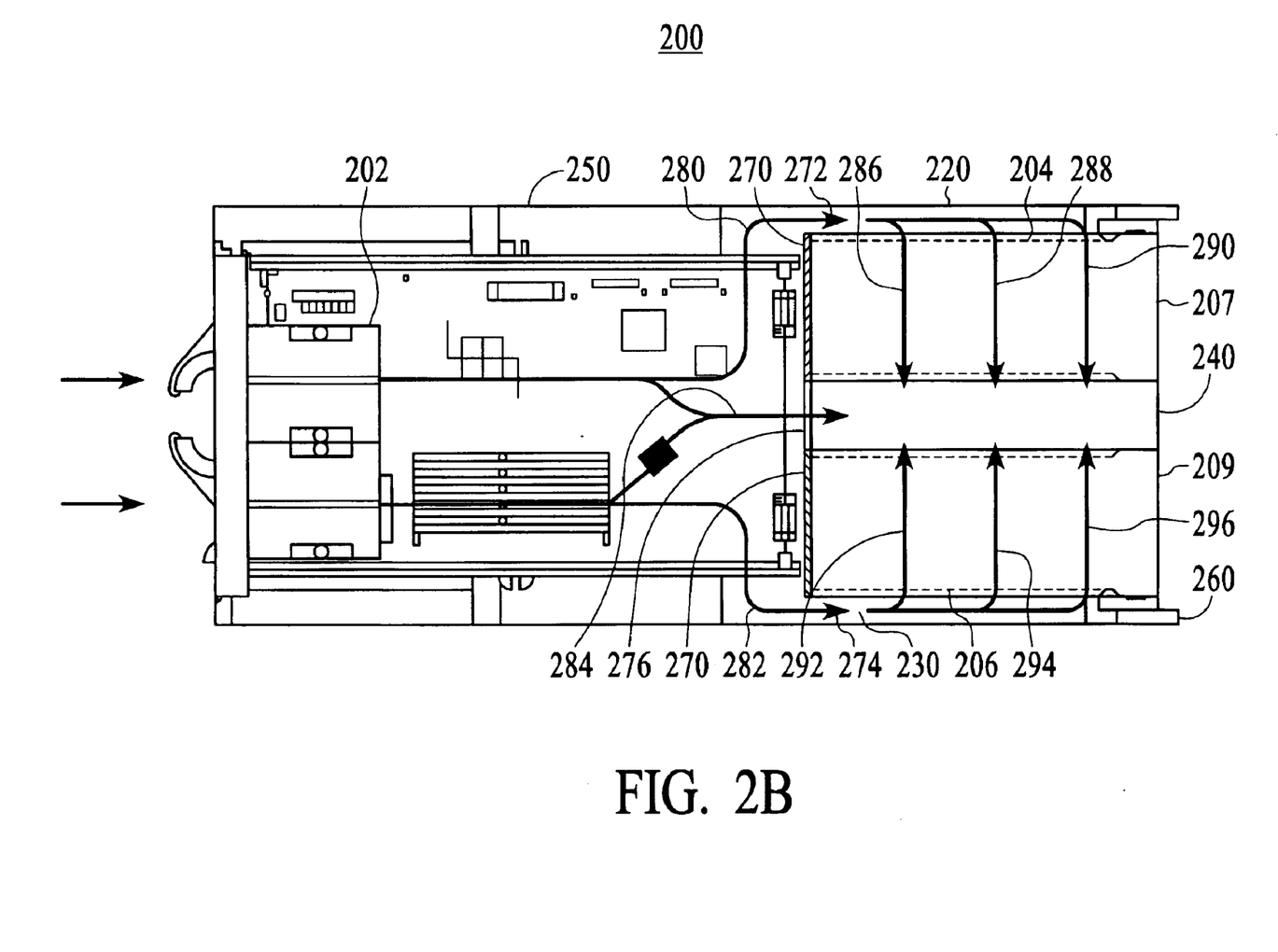
FIG. 2B is a side view of a preferred embodiment of a system in accordance with the present invention for packaging a computer system.

FIG. 2A is an exploded, perspective view of a preferred embodiment of a system 200 in accordance with the present invention for packaging a computer system. FIG. 2B is a side view of a preferred embodiment of a system 200 in accordance with the present invention for packaging a computer system. The system 200 is a preferred implementation of the system 100' depicted in FIG. 1B. Referring to FIGS. 2A and 2B, the computer system includes fourteen blades 202, a first (top) set of devices 204, a second (bottom) set of devices 206, and a midplane 270. In addition, the computer system includes apposing blowers 207 and 209. The system 200 includes main chassis 250 and an SPC chassis 260. The main chassis 250 has a first cavity 210 and a second cavity 212 therein. The first cavity is configured to fit the blades 202, as well as a peripheral device 208, shown as a CD drive or floppy. The main chassis 250 is preferably configured such that each of the blades 202 is hot pluggable into the first cavity 210.

The SPC chassis 260 is configured to retain the modules for the devices 204 and 206. In a preferred embodiment, the devices 204 and 206 are hot pluggable into the SPC chassis 260. In addition, the SPC chassis 260 is configured to plug into the main chassis 250. In particular, the SPC chassis 260 can be retained in the second cavity 212 of the main chassis 250 and to be easily locked in place. The common plenum 240 is between the modules for the devices 204 and 206 and between the blowers 207 and 209. The first plenum 220 is formed above the SPC chassis 260 and between the SPC 260 chassis and the main chassis 250. The second plenum 230 is formed below the SPC chassis 260 and between the SPC chassis 260 and the main chassis 250. However, in an alternate embodiment, the first plenum 220 and the second plenum 230 might be formed within the SPC chassis. The SPC chassis 260 is configured such that for air flowing through the system 100', the devices 204 and 206 are in series with the blades 202, but are in parallel to each other.

The midplane 270 is preferably a printed circuit board to which the blades 202, devices 204 and 206, and blowers 207 and 209 connect. In addition, the midplane 270 includes apertures 276' in a central portion of the midplane 270. The apertures 276 in the midplane 270 provide a path for air from the blades 202 to the common plenum 240. In addition, when in place, apertures 272 and 274 are formed between the main chassis 250 and the midplane 270. The apertures 272 and 274 provide a path for air from the blades 202 to the first plenum 220 and second plenum 230, respectively. Thus, can be seen by the arrows 280, 282, and 284, air used to cool the blades 202 is split between the first plenum 220, the second plenum 230, and the common plenum 240. The air in the first plenum 220 is drawn through the first set of devices 204 and into the common plenum 240. Similarly, the air in the second plenum 230 is drawn through the second set of devices 206 and into the common plenum 240. This can be seen by the arrows 286, 288, 290, 292, 294, and 296. Thus, air used to cool the blades 202 is also used for cooling the devices 204 and 206. The air used to cool only the blades 202 (shown by the arrow 284) and the air used to cool the devices 204 and 206 (shown by arrows 286, 288, 290, 292, 294, and 296) is collected in the common plenum 240, and exhausted.

Due to the arrangement of the plenum 220, 230, and 240, as well as the placement of the blades 202 and devices 204 and 206, higher density packing of the blades 202 is possible while meeting the cooling requirements of the blades 202, devices 204, and devices 206. In addition, because many of the components are configured to plug into portions of the chassis and, in a preferred embodiment, hot pluggable, assembly and disassembly of the system 200 is facilitated. As a result, manufacturing and servicing are simplified.

Figure 3:
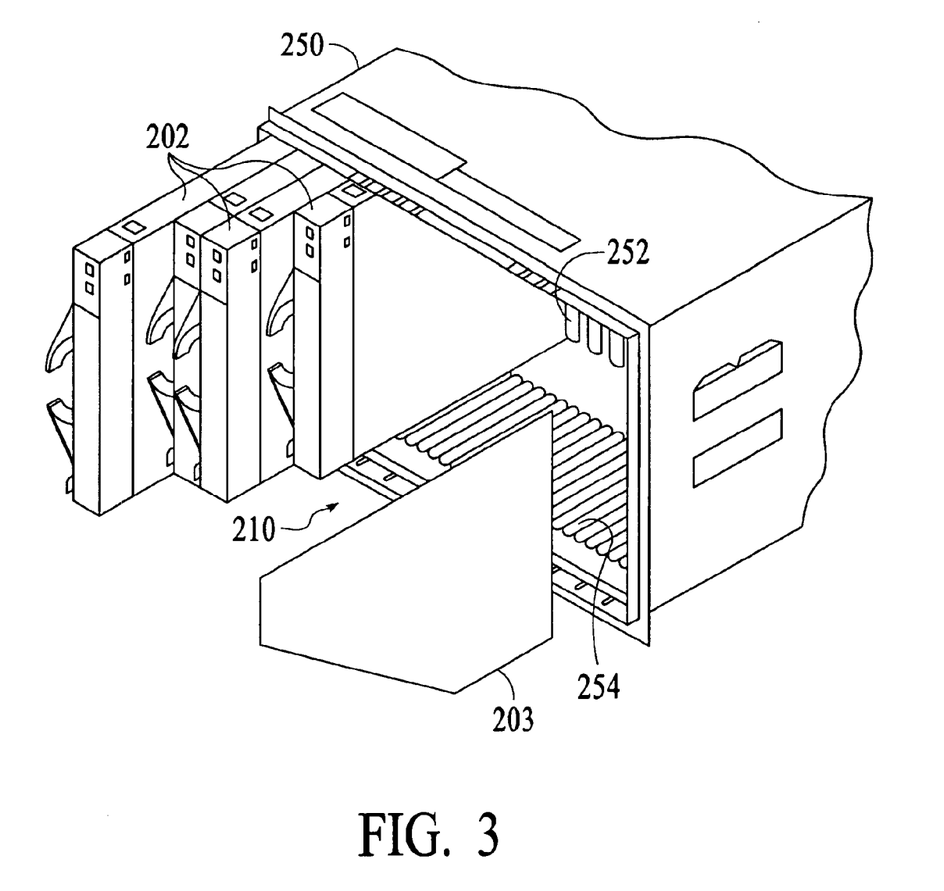
FIG. 3 is a perspective view of the front of the main chassis in a preferred embodiment of a system in accordance with the present invention for packaging a computer system.

FIGS. 3–6 depict various views of the portions of a preferred embodiment of the system 200 in accordance with the present invention. Thus, particular features of the embodiment of the system 200 in accordance with the present invention are described. FIG. 3 is a perspective view of the front of the main chassis 250 in a preferred embodiment of a system 200 in accordance with the present invention for packaging a computer system. The main chassis 250 is depicted with only some of the blades 202 in place. In addition, a service card 203 is shown. The service card 203 also fits within the first cavity 210. In addition, the blades 202 and cavity 210 are configured such that the blades 202 can be hot plugged into the corresponding spacer, fitting into oval-shaped apertures 254 (only one marked for clarity). The main chassis also includes a set of back flow dampers 252 (only one marked for clarity) for each blade 202. The air restriction dampers 252 close when a corresponding blade (not shown) is removed. Consequently, The air restriction dampers 252 provide an air resistance substantially equal to that of the blade 202 when the blade 202 is removed. Thus, when a blade 202 is removed (for example for servicing), air will not bypass other, installed blades. As a result, sufficient cooling is still provided for the remaining blades.

Figure 4:
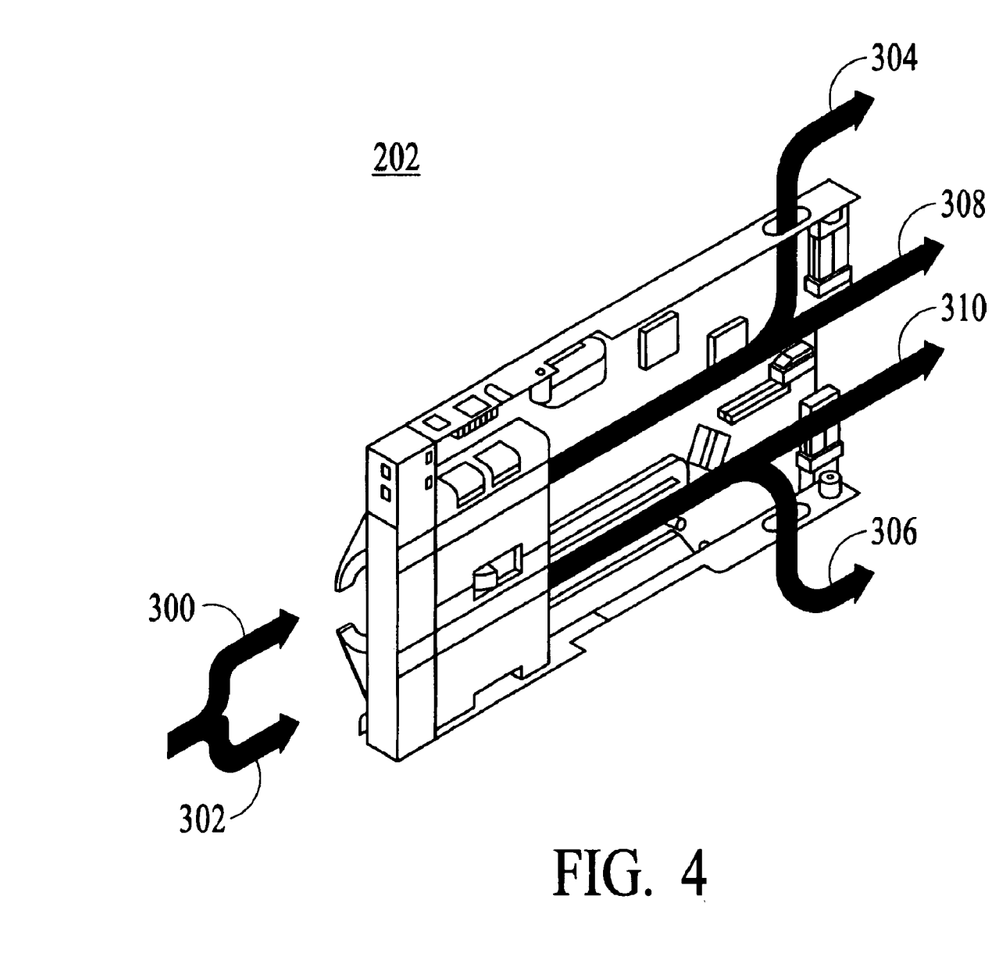
FIG. 4 is a perspective view depicting the airflow through a blade in a preferred embodiment of a system in accordance with the present invention for packaging a computer system.

FIG. 4 is a perspective view depicting the airflow through a blade 202 in a preferred embodiment of a system 200 in accordance with the present invention for packaging a computer system. The arrows 300 and 302 depict the flow into the front of the blade 202 and, therefore, the front of the main chassis 250. As depicted by the arrows 300 and 302, the air drawn into the front of the blade 202 is capable of cooling the blade 202. In addition, the air passes through the blade 202, cooling the blade 202, and splits at the rear of the blade 202. A portion of the air, depicted by arrow 304, is directed up and eventually arrives at the first plenum 220 (not shown). A portion of the air, depicted by arrow 306, is directed down and eventually arrives at the second plenum 230 (not shown). Finally, a remaining portion of the air, depicted by arrows 308 and 310, travels from the blade 202 to the common plenum 240 (not shown). Thus, the air used to cool the blade 202 can be split between the plenums 220, 230, and 240, and either used to cool the devices 204 and 206, or expelled.

Figures 5A, 5C:
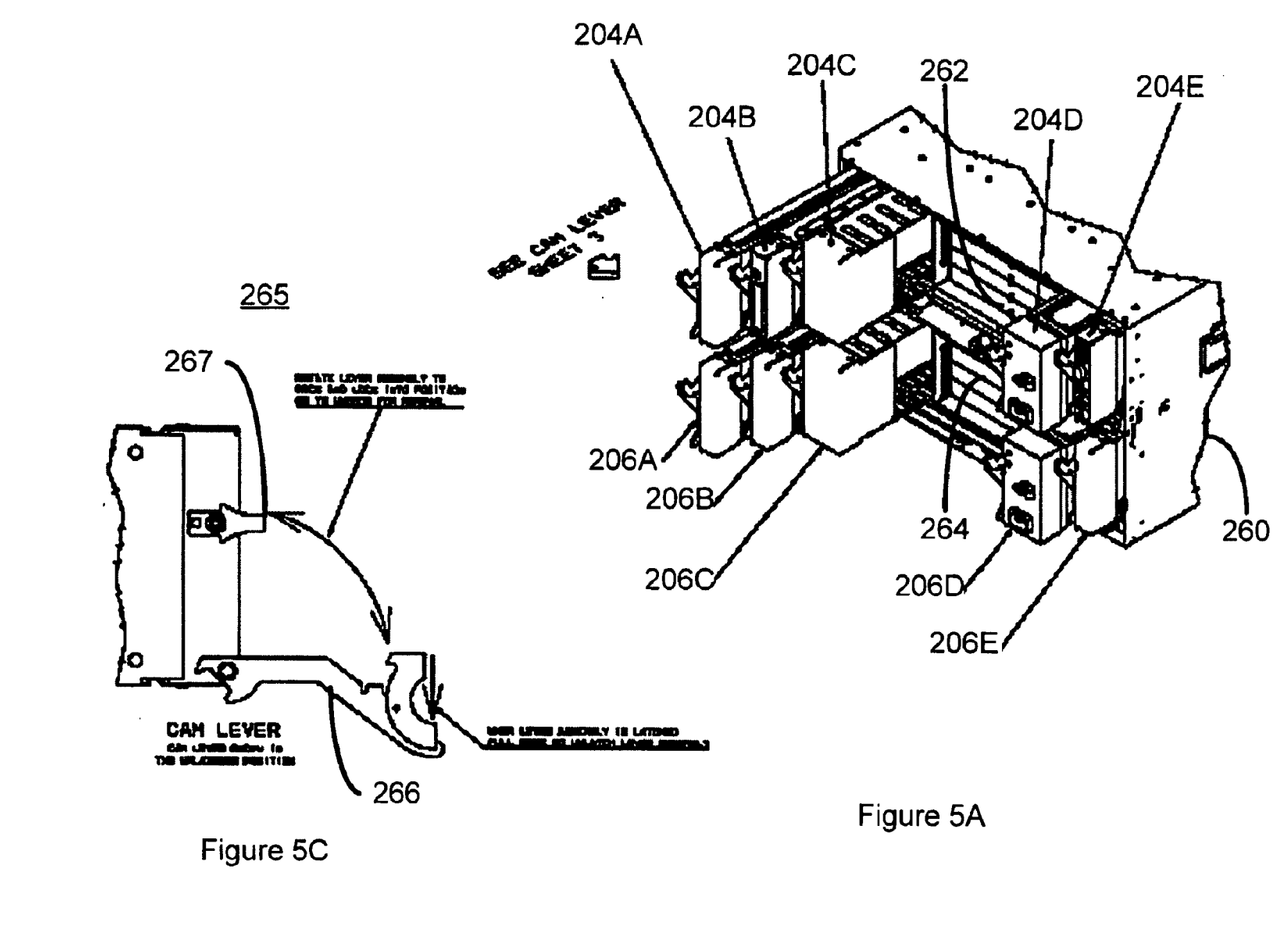
FIG. 5A is a perspective view of the back of the SPC chassis in a preferred embodiment of a system in accordance with the present invention for packaging a computer system in which certain modules are partially removed.
FIG. 5C is a side view of one embodiment of a locking mechanism for the modules plugged into the SPC chassis.
Figure 5B:
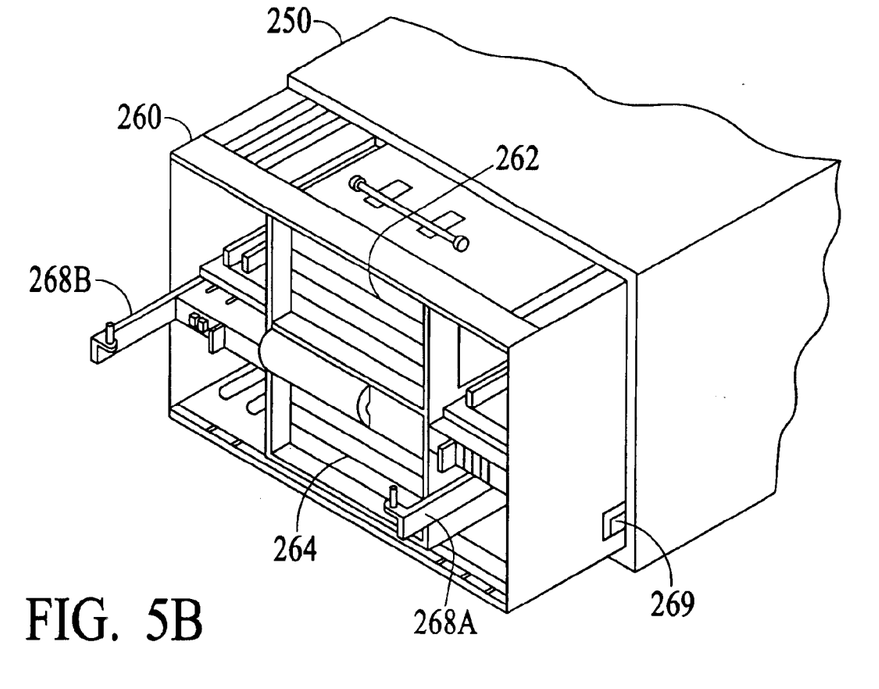
FIG. 5B is a perspective view of the back of the SPC chassis in a preferred embodiment of a system in accordance with the present invention for packaging a computer system.

FIG. 5A is a perspective view of the back of the SPC chassis 260 in a preferred embodiment of a system in accordance with the present invention for packaging a computer system in which certain modules are partially removed. FIG. 5B is a perspective view of the back of the SPC chassis 260 in a preferred embodiment of a system in accordance with the present invention for packaging a computer system. Referring to FIGS. 5A–5B, the devices 204 at the top include modules 204A, 204B, 204C, 204D and 204E. In the embodiment shown, the devices 204 are as follows. Module 204A is a switch module or a module filler. Module 204B is an Ethernet module. Module 204C is a power supply assembly or a power supply filler. Module 204D is another power supply assembly. Module 204E is a management module. Similarly, in the embodiment shown, the devices 206 include modules 206A, 206B, 206C, 206D and 206E and are as follows. Module 206A is a switch module or a module filler. Module 206B is an Ethernet module. Module 206C is a power supply assembly or a power supply filler. Module 206D is another power supply assembly. Module 206E is a management module. However, nothing prevents the devices 204 and 206 from containing different and/or additional modules.

FIG. 5C depicts the locking mechanism 265 for the modules 204A, 204B, 204C, 204D, 204E, 206A, 206B, 206C, 206D, and 206E. This locking mechanism 265 can also be seen in FIG. 5A. Referring to FIGS. 5A–5C, the locking mechanism 265 includes a cam lever 266 on the module 204A, 204B, 204C, 204D, 204E, 206A, 206B, 206C, 206D, and 206E and a corresponding catch 267 on the SPC chassis 260. The SPC chassis 260 and modules 204A, 204B, 204C, 204D, 204E, 206A, 206B, 206C, 206D, and 206E are preferably configured such that the modules 204A, 204B, 204C, 204D, 204E, 206A, 206B, 206C, 206D, and 206E are all hot pluggable. Thus, as is depicted in FIG. 5A, each module can be separately removed. In order to lock one of the modules 204A, 204B, 204C, 204D, 204E, 206A, 206B, 206C, 206D, and 206E in place, the cam lever 266 is merely rotated to lock onto catch 267 on the SPC chassis 260. As a result, the modules 204A, 204B, 204C, 204D, 204E, 206A, 206B, 206C, 206D, and 206E can be easily be individually installed and removed for service.

In addition, the blowers 207 and 209 (not shown in FIGS. 5A and 5B, but located behind backflow dampers 262 and 264) can be separately removed. Furthermore, the SPC chassis 260 includes backflow dampers 262 and 264 for blowers 207 and 209, respectively. Backflow dampers 262 and 264 help prevent unwanted backflow of air during a blower fail condition into the blowers 207 and 209 and, therefore, the common plenum 240.

The SPC chassis 260 is also modular in nature and easily installed and removed from the main chassis 250. The SPC chassis 260 preferably includes cam levers 268A and 268B, as well as chassis stops 269. A corresponding chassis stop (not shown) preferably resides opposite to the chassis stop 269. The SPC chassis 260 fits into the cavity 212 within the main chassis 250. The SPC chassis 260 can be plugged into the main chassis 250 as a unit. In order to lock the SPC chassis in place, the cam levers 268A and 268B are rotated to lock into the main chassis 250. When installing the SPC chassis 260, the chassis stops 269 merely slip into place. However, when removing the SPC chassis 260, the cam levers 268A and 268B are unlocked and may be used to pull out the SPC chassis 260 until the chassis stops 269 engage. The chassis stops 269 are depressed to release the SPC chassis from the main chassis 250. Thus, the SPC chassis 260 can be easily installed and removed from the main chassis 250. Consequently, both assembly and servicing of the modules within the SPC chassis 260, as well as the SPC chassis itself, are facilitated.

Figure 6:
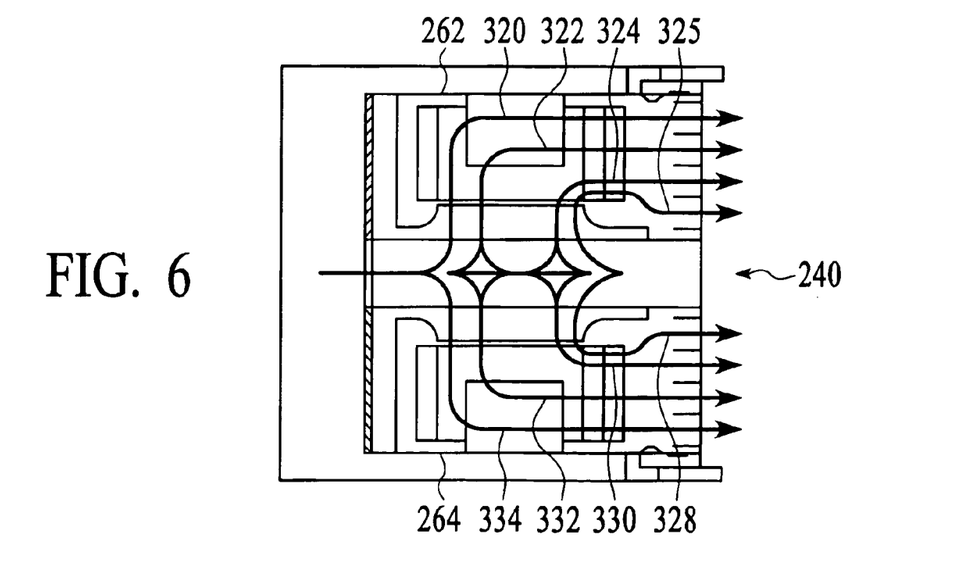
FIG. 6 is a side view depicting the airflow exiting the common plenum and the two apposed blowers in a preferred embodiment of a system in accordance with the present invention for packaging a computer system.

FIG. 6 is a side view depicting the airflow exiting the common plenum 240 in a preferred embodiment of a system 200 in accordance with the present invention for packaging a computer system. As can be seen from arrows 320, 322, 324, 326, 328, 330, 332, and 334, the air in the common plenum 240 is drawn through the blowers 207 and 209 and expelled through the backflow dampers 262 and 264. Furthermore, as can be seen in FIG. 6, the blowers 207 and 209 are positioned such that each blower 207 or 209 can remove air from the common plenum 240 and exhaust the air from the common plenum 240. As a result, if one of the blowers 207 or 209 fails, the other blower 209 or 207, respectively, can continue to remove air from the common plenum 240. Cooling of the blades 202 and devices 204 and 206 can thus continue can be carried out even when one of the blowers 207 or 209 fails. Consequently, operation of the computer system housed in the system 200 is not interrupted by failure of one of the blowers 207 and 209.

Figure 7:
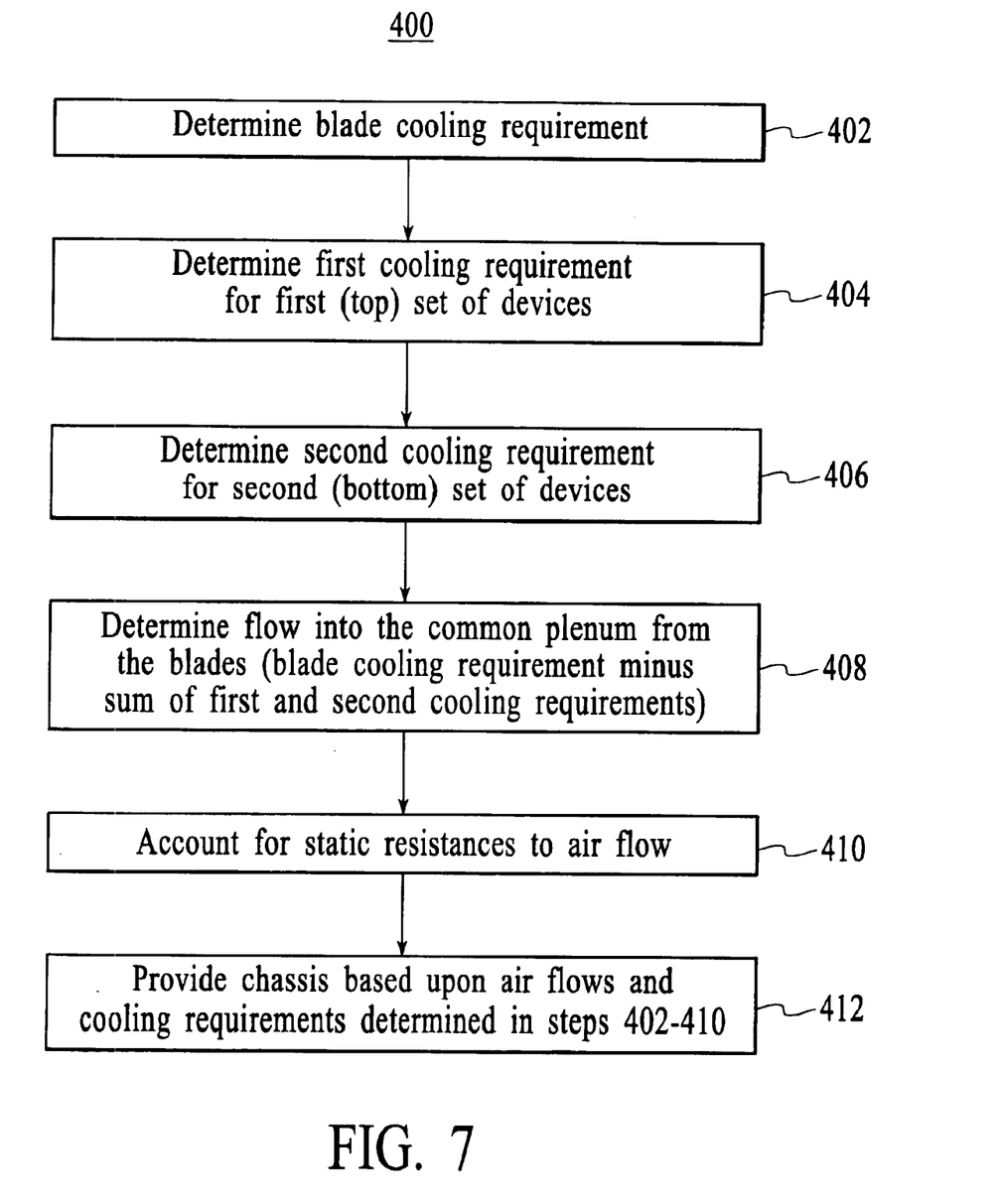
FIG. 7 is a high-level flow chart of one embodiment of a method in accordance with the present invention for providing a system in accordance with the present invention for packaging a computer system

FIG. 7 is a high-level flow chart of one embodiment of a method 400 in accordance with the present invention for providing a system in accordance with the present invention for packaging a computer system. The method 400 is described in the context of the system 200. However, one of ordinary skill in the art will readily recognize that the method 400 could be applied to other systems, including, but not limited to, the systems 100 and 100'.

The blade cooling requirement for the blades residing in parallel in the main chassis 250 is determined, via step 402. In a preferred embodiment, the blade cooling requirement determined is for the maximum number of blades that can be placed in the cavity 210. In a preferred embodiment, the maximum number of blades 202 is fourteen blades. The blade cooling requirement is for the maximum number of blades even though the computer system might be run with fewer blades. A first cooling requirement for the devices 204 is determined, via step 404. The first cooling requirement is thus for all of the devices 204 that reside in parallel with the devices 206, but in series with the blades 202. Thus, in a preferred embodiment, step 404 determines the cooling requirements for modules 204A, 204B, 204C, 204D, and 204E. A second cooling requirement for the devices 206 is determined, via step 406. The second cooling requirement is thus for all of the devices 206 that reside in parallel with the devices 204, but in series with the blades 202. Thus, in a preferred embodiment, step 406 determines the cooling requirements for modules 206A, 206B, 206C, 206D, and 206E. The difference between the blade cooling requirement and the sum of the first and second cooling requirements is determined in step 408. Thus, the amount of air that will be provided to the common plenum 240 from the blades 202 is determined in step 408.

The static resistances to air flow in the blade cooling requirement, the first cooling requirement, the second cooling requirement, and the difference between these requirements determined in step 408 is determined, via step 410. Thus, the resultant of step 410 should be the amount of air flow through the blades 202, the amount of air flow into the first plenum 240 and through the devices 204, the amount of air flow into the second plenum 230 and through the devices 206, and the amount of air flow into the common plenum 240 from the blades 202 and from the devices 204 and 206.

The system 200 having a first cavity 210, a first plenum 220, a second plenum 230 and a common plenum 240 therein is provided, via step 412. The chassis 200 provided in step 412 is configured such that the flows determined in step 402–410 can be achieved. In a preferred embodiment, step 412 also includes providing the system 200 having the modular design described above. Thus, the resultant of the method 400 is, therefore, the system 200 (or the system 100 or 100'). Thus, the method 400 provides a system for packaging a computer system which allows for a high density of components of the computer system while facilitating assembly and servicing.

A method and system has been disclosed for providing a high-density packaging system for a computer system that retains ease of access for the components in the computer system. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for packaging a computer system capable of including a plurality of blades, a first plurality of devices, and a second plurality of devices, the system comprising:

a chassis having a first cavity, a first plenum, a second plenum and a common plenum therein, the first cavity for retaining the plurality of blades in parallel, the chassis being configured such that air sufficient to cool the plurality of blades is drawn into the chassis;

wherein the first plenum is configured such that a first portion of the air is drawn from the plurality of blades into the first plenum, through the first plurality of devices and into the common plenum, the first portion of the air being sufficient to cool the first plurality of devices;

wherein the second plenum is configured such that a second portion of the air is drawn from the plurality of blades into the second plenum, through the second plurality of devices and into the common plenum, the second portion of the air being sufficient to cool the second plurality of devices; and wherein the common plenum is configured such that a remaining portion of the air is drawn from the plurality of blades into the common plenum, the first portion of the air is received into the common plenum from the first plurality of devices, and the second portion of the air is received into the common plenum from the second plurality of devices.

2. The system of claim 1 wherein the chassis further includes:

a main chassis having the first cavity and a second cavity therein;

a switch-power-cooling (SPC) chassis configured to fit in the second cavity of the main chassis, the SPC chassis including a first region for the first plurality of devices, a second region for the second plurality of devices, and the common plenum therein, the first plenum and the second plenum being formed between the main chassis and the SPC chassis.

3. The system of claim 2 wherein the SPC chassis further includes:

a first region and a second region, the first region for retaining the first plurality of devices, the second region for retaining the second plurality of devices, the common plenum residing between the first region and the second region, the first region residing between the first plenum and the common plenum, the second region residing between the second plenum and the common plenum.

4. The system of claim 2 wherein the SPC chassis includes:

at least one cam lever; and at least one SPC chassis stop, the at least one cam lever and the at least one chassis stop cooperating to lock the SPC chassis in the main chassis when the at least one cam lever is in a first position, and to unlock the SPC chassis and allow the SPC chassis to be removed from the main chassis when the at least one cam lever is in a second position and the at least one chassis stop is depressed.

5. The system of claim 2 further comprising:

a midplane having at least one central aperture therein, the midplane residing between the plurality of blades and the SPC chassis, the at least one central aperture allowing the remaining portion of air to be drawn into the common plenum.

6. The system of claim 2 wherein the SPC chassis further holds at least one blower located at an exit for the common plenum, the at least one blower for expelling the air from the common plenum and wherein the SPC chassis further includes:

a plurality of backflow dampers for each of the at least one blower.

7. The system of claim 2 wherein the main chassis includes a plurality of air restriction dampers for each of the plurality of blades, the plurality of air restriction dampers residing between the plurality of blades and the first plenum, the second plenum, and the common plenum, each of the plurality of air restriction dampers closing upon removal of a corresponding blade.

8. The system of claim 2 wherein the SPC chassis includes a plurality of catches, wherein the first plurality of devices and the second plurality of devices are packaged in a plurality of modules, each of the plurality of modules including a cam lever, the cam lever for locking the module to the SPC chassis using a corresponding catch of the plurality of catches.

9. The system of claim 8 wherein the SPC chassis is configured such that each of the plurality of modules is hot pluggable into the SPC chassis.

10. The system of claim 2 wherein the main chassis is further configured to receive an peripheral device, the peripheral device being hot pluggable into the main chassis.

11. The system of claim 2 wherein each of the plurality of blades is hot pluggable into the main chassis.

12. A method for providing a system for packaging a computer system capable of including a plurality of blades, a first plurality of devices, and a second plurality of devices, the method comprising:

determining a blade cooling requirement for the plurality of blades residing in parallel;

determining a first cooling requirement for the first plurality of devices;

determining a second cooling requirement for the second plurality of devices;

determining a difference between the blade cooling requirement and the sum of the first cooling requirement and the second cooling requirement;

accounting for static resistances to air flow in the blade cooling requirement, the first cooling requirement, the second cooling requirement, and the difference;

providing a chassis having a first cavity, a first plenum, a second plenum and a common plenum therein, the first cavity for retaining the plurality of blades in parallel, the chassis being configured such that the blade cooling requirement is satisfied by air sufficient drawn into the chassis and through the plurality of blades, the first plenum being configured such that the first cooling requirement is satisfied by a first portion of the air sufficient drawn into the first plenum from the plurality of blades, through the first plurality of devices and into the common plenum, wherein the second plenum is configured such that the second cooling requirement is satisfied by a second portion of the air drawn into the second plenum, through the first plurality of devices and into the common plenum, and wherein the common plenum is configured to receiving the difference from the plurality of blades, the first portion of the air from the first plurality of devices, and the second portion of the air from the second plurality of devices.

13. The method of claim 12 wherein the chassis providing step further includes the steps of:

providing a main chassis to includes the first cavity and a second cavity therein;

providing a switch-power-cooling (SPC) chassis configured to fit in the second cavity of the main chassis, the SPC chassis including a first region for the first plurality of devices, a second region for the second plurality of devices, and the common plenum therein, the first plenum and the second plenum being formed between the main chassis and the SPC chassis.

14. The method of claim 13 wherein the SPC chassis further includes a first region and a second region therein, the first region for retaining the first plurality of devices, the second region for retaining the second plurality of devices, the common plenum residing between the first region and the second region, the first region residing between the first plenum and the common plenum, the second region residing between the second plenum and the common plenum.

15. The method of claim 13 wherein the SPC chassis providing step further includes the steps of:

providing at least one cam lever on the SPC chassis; and providing at least one SPC chassis stop on the SPC chassis, the at least one cam lever and the at least one chassis stop cooperating to lock the SPC chassis in the main chassis when the at least one cam lever is in a first position, and to unlock the SPC chassis and allow the SPC chassis to be removed from the main chassis when the at least one cam lever is in a second position and the at least one chassis stop is depressed.

16. The method of claim 13 further comprising the step of:

providing a midplane between the plurality of blades and the SPC chassis, the midplane having at least one central aperture therein, the at least one central aperture allowing the remaining portion of air to be drawn into the common plenum.

17. The method of claim 13 wherein the SPC chassis further holds at least one blower located at an exit for the common plenum, the at least one blower for expelling the air from the common plenum and wherein the SPC chassis providing step further includes the step of:

providing a plurality of backflow dampers for each of the at least one blower.

18. The method of claim 13 wherein the main chassis includes a plurality of air restriction dampers for each of the plurality of blades, the plurality of air restriction dampers residing between the plurality of blades and the first plenum, the second plenum, and the common plenum, each of the plurality of air restriction dampers closing upon removal of a corresponding blade.

19. The method of claim 13 wherein the SPC chassis includes a plurality of catches, wherein the first plurality of devices and the second plurality of devices are packaged in a plurality of modules, each of the plurality of modules including a cam lever, the cam lever for locking the module to the SPC chassis using a corresponding catch of the plurality of catches.

20. The method of claim 19 wherein the SPC chassis providing step further includes the step of:

configuring the SPC chassis such that each of the plurality of modules is hot pluggable into the SPC chassis.

21. The method of claim 13 wherein the main chassis providing step further includes the step of:

configuring the main chassis to receive a peripheral device, the peripheral device being hot pluggable into the main chassis.

22. The method of claim 13 wherein the main chassis providing step further includes the step of:

configuring the main chassis such that each of the plurality of blades is hot pluggable into the main chassis.

* * * * *